United States Patent
Kim et al.

(10) Patent No.: US 10,944,537 B2
(45) Date of Patent: Mar. 9, 2021

(54) CLOCK RECOVERY DEVICE AND SOURCE DRIVER FOR RECOVERING EMBEDDED CLOCK FROM INTERFACE SIGNAL

(71) Applicant: SILICON WORKS CO., LTD., Daejeon (KR)

(72) Inventors: Byung Guk Kim, Daejeon (KR); Hyun Kyu Jeon, Daejeon (KR)

(73) Assignee: SILICON WORKS CO., LTD., Daejeon (KR)

( * ) Notice: Subject to any disclaimer, the term of this patent is extended or adjusted under 35 U.S.C. 154(b) by 0 days.

(21) Appl. No.: 16/668,962

(22) Filed: Oct. 30, 2019

(65) Prior Publication Data
US 2020/0145181 A1   May 7, 2020

(30) Foreign Application Priority Data
Nov. 5, 2018  (KR) .......................... 10-2018-0134275

(51) Int. Cl.
*H04L 7/00* (2006.01)

(52) U.S. Cl.
CPC .................. *H04L 7/0037* (2013.01)

(58) Field of Classification Search
CPC ..... H04L 7/033; H04L 7/0037; H04L 7/0337; H04L 7/0087; H04J 3/0638; G09G 5/008; H03L 7/0807
See application file for complete search history.

(56) References Cited

U.S. PATENT DOCUMENTS

| | | | |
|---|---|---|---|
| 5,923,197 A * | 7/1999 | Arkin | H03K 5/156 327/262 |
| 8,565,362 B2 | 10/2013 | Kim | |
| 2003/0227310 A1 * | 12/2003 | Iwata | H04L 7/0037 327/165 |
| 2006/0188048 A1 * | 8/2006 | Suzuki | H04L 25/4904 375/361 |
| 2009/0079719 A1 * | 3/2009 | Lee | H03L 7/0891 345/204 |
| 2011/0242066 A1 * | 10/2011 | Jeon | G09G 5/008 345/204 |
| 2011/0286562 A1 * | 11/2011 | Jeon | H03L 7/0807 375/371 |
| 2015/0163050 A1 * | 6/2015 | Han | H04L 7/04 375/362 |
| 2016/0125821 A1 * | 5/2016 | Lee | G09G 3/3688 345/92 |
| 2016/0189621 A1 * | 6/2016 | Kim | G09G 3/3258 345/215 |
| 2016/0260411 A1 * | 9/2016 | Han | G09G 5/008 |
| 2017/0070338 A1 * | 3/2017 | Giriyappa | H04L 7/0037 |
| 2018/0173585 A1 * | 6/2018 | Moon | G09G 3/20 |

FOREIGN PATENT DOCUMENTS

JP   2014-062972 A   4/2014
KR   10-1930532 B1   12/2018

* cited by examiner

*Primary Examiner* — Aristocratis Fotakis
(74) *Attorney, Agent, or Firm* — Fenwick & West LLP

(57) ABSTRACT

In generating a mask signal used to recover a clock signal embedded in an interface signal, the mask signal may be generated by comparing a plurality of comparison signals, generated by delaying a plurality of mask rising signals by a predetermined time, with the clock signal and selecting one mask rising signal used to generate a comparison signal close to one portion of the clock signal from among the plurality of mask rising signals.

15 Claims, 14 Drawing Sheets

CLOCK RECOVERY DEVICE AND SOURCE DRIVER FOR RECOVERING EMBEDDED CLOCK FROM INTERFACE SIGNAL

CROSS REFERENCE TO RELATED APPLICATION

This application claims priority from Republic of Korea Patent Application No. 10-2018-0134275, filed on Nov. 5, 2018, which is hereby incorporated by reference in its entirety.

BACKGROUND

1. Field of Technology

An embodiment relates to a technique for recovering an embedded clock from an interface signal.

2. Description of the Prior Art

Two or more devices may exchange information through interface signals.

An interface signal may be divided into a plurality of unit times, and the value of a field may be included in each unit time. This field is also called a bit. When a reception device recognizes an interface signal divided into unit times, the reception device can read the value of each bit received through the interface signal.

To divide an interface signal into unit times, a clock signal indicating each unit time is required. The clock signal may be transmitted, along with the interface signal, from a transmission device to a reception device.

An interface signal including the value of each field may be transmitted and received through a separate line from that for a clock signal. A reception device may receive an interface signal through a first line, may receive a clock signal through a second line, and may divide the interface signal into unit times using the clock signal to recognize the interface signal, thereby obtaining data from the interface signal.

However, when an interface signal and a clock signal are configured with separate lines, electromagnetic interference (EMI) between the clock signal and the interface signal may occur, a data sampling error may occur due to the difference in transmission delay between the lines, and a problem about spatial arrangement may occur due to an increase in the number of lines.

In order to solve these problems, transmission and reception devices may transmit and receive a clock signal embedded in an interface signal. Accordingly, it is possible to resolve EMI, a data sampling error, and a problem about spatial arrangement.

According to an embedded clock method in which a clock signal is embedded in an interface signal, the clock signal may be inserted in some time periods of the interface signal to be transmitted or received. In addition, a reception device may extract the clock signal from the interface signal using a mask signal indicating a time period in which the clock signal is inserted.

A mask signal generation circuit may generate a mask signal to indicate a time period including a portion into which a clock signal is inserted. However, when the mask signal generation circuit generates the mask signal, the mask signal may not accurately indicate the time period into which the clock signal is inserted due to the processing delay time of a logic circuit. For example, the clock signal may not be included in the time period indicated by the mask signal in the interface signal, or a data signal or dummy signal may be included in the time period. In this case, the reception device cannot recover the clock signal from the interface signal, or a transmission device may generate a clock signal having a different characteristic from an intended clock signal.

SUMMARY

An aspect of embodiments is to provide a technique for accurately recovering a clock signal from an interface signal.

To achieve the foregoing aspect of the present disclosure, one embodiment provides a clock recovery device including: a mask signal selecting unit configured to compare a plurality of comparison signals, generated by delaying a plurality of mask rising signals by a predetermined time, with a clock signal and to select one mask rising signal used to generate a comparison signal close to one portion of the clock signal from among the plurality of mask rising signals; a mask signal generating unit configured to form a rising edge of the mask signal according to the selected one mask rising signal; a clock extracting unit configured to generate an extraction clock from an interface signal with a clock signal embedded therein in a time period in which a mask signal is activated; and a time-delay controlling unit configured to generate the plurality of mask rising signals by time-delaying the extraction clock.

In the clock recovery device, the mask signal selecting unit may reflect a time, obtained by simulating a signal processing delay time of the mask signal generating unit, in the predetermined time to generate the plurality of comparison signals.

In the clock recovery device, one period of the interface signal may be divided into a plurality of unit times by which information is divided, and K unit times (where K is a positive number that is a multiple of 0.5) may be additionally reflected in the predetermined time.

In the clock recovery device, the mask signal generating unit may generate the plurality of comparison signals using a simulation circuit that causes a time delay substantially corresponding to the signal processing delay time.

In the clock recovery device, one period of the interface signal may be divided into a plurality of unit times by which information is divided, and the mask signal selecting unit may receive a plurality of preliminary comparison signals, generated by delaying the plurality of mask rising signals by 0.5 unit times, from the time-delay controlling unit and may generate the plurality of comparison signals by respectively delaying the plurality of preliminary comparison signals by the signal processing delay time of the mask signal generating unit.

In the clock recovery device, the mask signal generating unit may generate a falling edge of the mask signal according to the extraction clock or may generate the falling edge of the mask signal according to a signal generated by delaying the extraction clock by a predetermined time.

In the clock recovery device, the time-delay controlling unit may include: a delay circuit configured to generate the plurality of data clock signals having different phases by time-delaying the extraction clock through a plurality of delay elements connected in series and to adjust a time-delay degree of each of the delay elements according to a voltage control signal; and a phase difference feedback unit configured to generate the voltage control signal corresponding to a phase difference between one data clock signal and another data clock signal resulting from the one data clock signal that has passed through a predetermined number of delay elements and to output the voltage control signal to each delay element.

Another embodiment provides a clock recovery device including: a clock extracting unit configured to generate an extraction clock through a signal from an interface signal with a clock signal embedded therein in a time period in which a mask signal is activated; a time-delay controlling unit configured to generate a plurality of mask rising signals by time-delaying the extraction clock; a mask signal selecting unit configured to sample the interface signal using a plurality of comparison signals, generated by delaying the plurality of mask rising signals by a predetermined time, and to select one mask rising signal corresponding to a portion where a sampled bit value is changed; and a mask signal generating unit configured to form a rising edge of the mask signal according to the selected one mask rising signal.

In the clock recovery device, the mask signal selecting unit may include a MUX circuit configured to select one mask rising signal from among the plurality of mask rising signals according to a selection signal generated in response to the portion where the bit value is changed.

In the clock recovery device, the mask signal selecting unit may sample the interface signal through a plurality of flip-flops configured to receive the interface signal through one terminal and the comparison signals through a clock terminal.

In the clock recovery device, the mask signal selecting unit may include a plurality of selection circuits configured to selectively output a zero signal corresponding to a bit value of 0 and the comparison signals to the clock terminal of the flip-flop, and each of the selection circuits may output one of the zero signal and the comparison signals according to a signal indicating the completion of clock training.

Still another embodiment provides a source driver including: a signal receiving unit configured to receive a display signal with a clock signal embedded therein; a clock recovery unit configured to generate a plurality of data clock signals by recovering the clock signal from the display signal; and a data driving unit configured to extract image data from the display signal according to the plurality of data clock signals and to drive pixels disposed on a panel according to the image data, wherein the clock recovery unit generates an extraction clock from the display signal in a time period in which a mask signal is activated, generates the plurality of data clock signals and a plurality of mask rising signals using the extraction clock, selects one mask rising signal, which is delayed by a predetermined time to generate a signal close to one portion of the clock signal, from among the plurality of mask rising signals, and forms a rising edge of the mask signal according to the one mask rising signal.

In the source driver, the clock recovery unit may include a lock signal output unit configured to output a lock signal, and the lock signal output unit may set a voltage level of the lock signal to a first level when a clock training is required, and may set the voltage level of the lock signal to a second level when the clock training is completed.

In the source driver, when the lock signal indicates the completion of the clock training, the clock recovery unit may consistently select a mask rising signal in an order determined through the clock training from among the plurality of mask rising signals.

In the source driver, the clock recovery unit may generate a falling edge of the mask signal according to the extraction clock or may generate the falling edge of the mask signal according to a signal generated by delaying the extraction clock by a predetermined time.

As described above, according to embodiments, it is possible to accurately recover a clock signal from an interface signal.

BRIEF DESCRIPTION OF THE DRAWINGS

The above and other aspects, features and advantages of the present disclosure will be more apparent from the following detailed description taken in conjunction with the accompanying drawings, in which.

DETAILED DESCRIPTION

Figure 1:
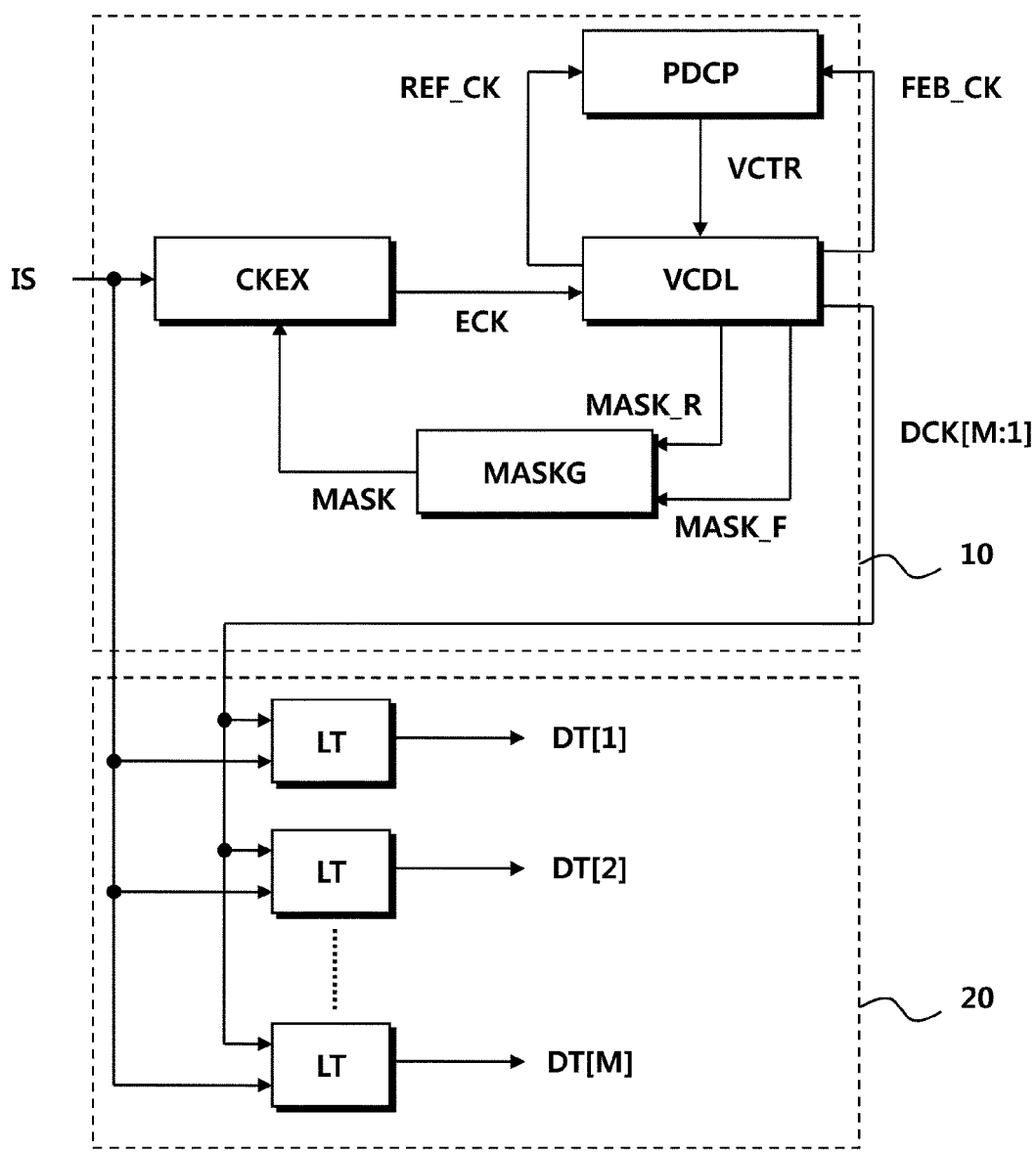
FIG. 1 is a block diagram illustrating a general data reception device according to an embodiment.

Hereinafter, some embodiments of the present disclosure will be described in detail with reference to the accompanying drawings. In adding reference numerals to elements in each drawing, the same elements will be designated by the same reference numerals as far as possible, although they are shown in different drawings. Further, in the following description of the present disclosure, a detailed description of known functions and configurations incorporated herein will be omitted when it is determined that the description may make the subject matter of the present disclosure rather unclear.

In addition, terms, such as first, second, A, B, (a), (b) or the like may be used herein when describing components of the present disclosure. These terms are merely used to distinguish one structural element from other structural elements, and a property, an order, a sequence or the like of a corresponding structural element are not limited by the term. When it is described in the specification that one component is "connected," "coupled" or "joined" to another component, it should be read that the first component may be directly connected, coupled or joined to the second component, but also a third component may be "connected," "coupled," and "joined" between the first and second components.

FIG. 1 is a block diagram illustrating a general data reception device.

Referring to FIG. 1, the data reception device may include a clock recovery unit 10 and a data extracting unit 20.

The clock recovery unit 10 may include a clock extracting unit CKEX, a voltage control delay line unit VCDL, a phase feedback unit PDCP, and a mask signal generating unit MASKG.

The clock extracting unit CKEX may generate an extraction clock ECK through a signal in a time period indicated by a mask signal MASK in an interface signal IS.

The voltage control delay line unit VCDL may generate a plurality of data clock signals DCK by time-delaying the extraction clock ECK. The voltage control delay line unit VCDL may control a time delay for the extraction clock ECK such that one data clock signal and another data clock signal among the plurality of data clock signals DCK are synchronized in phase.

For example, the voltage control delay line unit VCDL may transmit one data clock signal generated by time-delaying the extraction clock ECK by one unit time to the phase feedback unit PDCP as a feedback clock signal FEB_CK and may transmit another data clock signal generated by time-delaying the extraction clock ECK by N+1 unit times to the phase feedback unit PDCP as a reference clock signal REF_CK.

In addition, the phase feedback unit PDCP may transmit a voltage control signal VCTR corresponding to the phase difference between the one data clock signal and the other data clock signal to the voltage control delay line unit VCDL. The voltage control delay line unit VCDL may adjust the time-delay time of the extraction clock ECK according to the voltage control signal VCTR, thereby synchronizing the one data clock signal and the other one data clock signal in phase. According to the synchronization, the phase difference between the data clock signals can be equal to the unit time by which information is divided.

The voltage control delay line unit VCDL may generate a mask rising signal MASK_R and a mask falling signal MASK_F in addition to the plurality of data clock signals DCK and may transmit the mask rising signal MASK_R and the mask falling signal MASK_F to the mask signal generating unit MASKG. Here, the mask rising signal MASK_R may be a signal time-delayed by R (R is an integer multiple of 0.5) unit times from the extraction clock ECK, and the mask falling signal MASK_F may be a signal time-delayed by Q (Q is an integer multiple of 0.5 and is a greater than R) unit times from the extraction clock ECK.

The mask signal generating unit MASKG may generate a mask signal MASK by generating a rising edge of the mask signal MASK according to the mask rising signal MASK_R and generating a falling edge of the mask signal MASK according to the mask falling signal MASK_F.

When the clock recovery unit 10 generates a data clock signal DCK, the data extracting unit 20 may latch an interface signal IS according to each data clock signal DCK using a latch circuit LT, thus generating a data signal DT.

Figure 2:
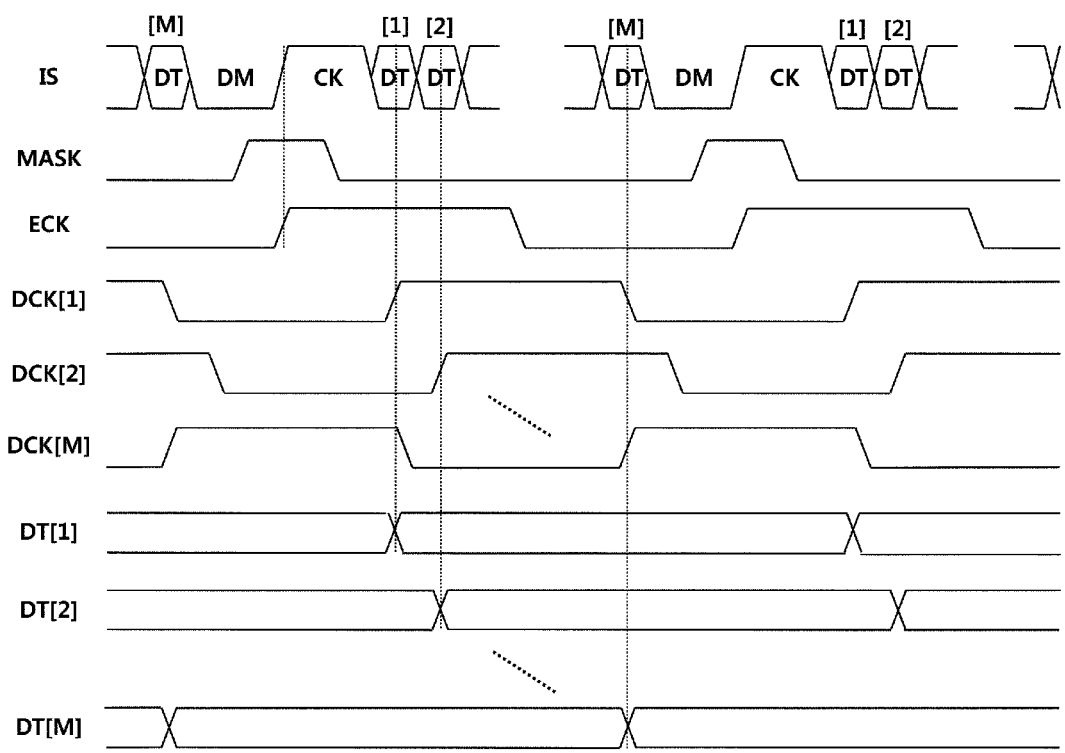
FIG. 2 is a timing diagram illustrating main signals in the data reception device illustrated in FIG. 1 according to an embodiment.

FIG. 2 is a timing diagram illustrating main signals in the data reception device illustrated in FIG. 1.

Referring to FIG. 2, a data signal DT, a dummy signal DM, and a clock signal CK may be inserted into an interface signal IS. Regarding the data signal DT, bits may be divided by a unit time, and one-bit data signal DT may be inserted in one unit time. The clock signal CK is a portion into which a clock is inserted and may have a length of one unit time or two unit times. The dummy signal DM is a portion other than the data signal DT or the clock signal CK and may be inserted to maintain an interval between the data signal DT and the clock signal CK or may be inserted as a reserved interval for extension of the data signal DT.

A mask signal MASK is a signal indicating a time period in which the clock signal CK is inserted in the interface signal IS. The clock recovery unit may extract the clock signal CK embedded in the interface signal IS in a time period between a rising edge of the mask signal MASK and a falling edge of the mask signal MASK. The clock signal is a signal that is repeated with a predetermined period, and the entire portion CK repeated according to a predetermined time period as illustrated in FIG. 2 may be considered as a clock signal. However, according to another aspect, a rising edge of the portion CK may be considered as a clock signal.

The clock extracting unit may detect a change in the level of the interface signal IS during a time period in which the mask signal MASK maintains a high level, and may generate an extraction clock ECK at the time when a rising edge or a falling edge appears in the interface signal IS.

The voltage control delay line unit may time-delay the extraction clock ECK to generate a plurality of data clocks DCK[M:1] (where M is a natural number of two or greater).

The data extracting unit may generate a data signal DT[M:1] by latching the interface signal IS at the rising edge of each data clock DCK.

The master signal generating unit may generate a mask signal MASK at a time delayed by a predetermined multiple of a unit time from the extraction clock ECK. When one period of the interface signal IS is divided into N unit times (where N is a natural number of 2 or greater), the master signal generating unit may generate a mask signal MASK such that a rising edge is formed at a time delayed by N−0.5 unit times from the extraction clock ECK and a falling edge is formed at a time delayed by N+0.5 unit times therefrom. Accordingly, the clock extracting unit can detect the clock signal CK of the interface signal IS at an intermediate time in the time period in which the mask signal MASK maintains the high level.

The rising edge and the falling edge of the mask signal MASK are generated by the voltage control delay line unit that time-delays the extraction clock ECK. The voltage control delay line unit may generate a mask rising signal at a time delayed by N−0.5 unit times from the extraction clock ECK and may generate a mask falling signal at a time delayed by N+0.5 unit times therefrom.

The mask signal generating unit may generate a mask signal MASK using the mask rising signal and the mask falling signal received from the voltage control delay line unit.

The mask signal generating unit may form a rising edge of the mask signal MASK according to the mask rising signal, and may form a falling edge of the mask signal MASK according to the mask falling signal using an internal circuit. However, since processing delay time occurs in the internal circuit, the rising edge of the mask signal MASK and the mask rising signal may not be synchronized and may have a predetermined time difference. Likewise, the falling edge of the mask signal MASK and the mask falling signal may not be synchronized and may have a predetermined time difference.

Figure 3:
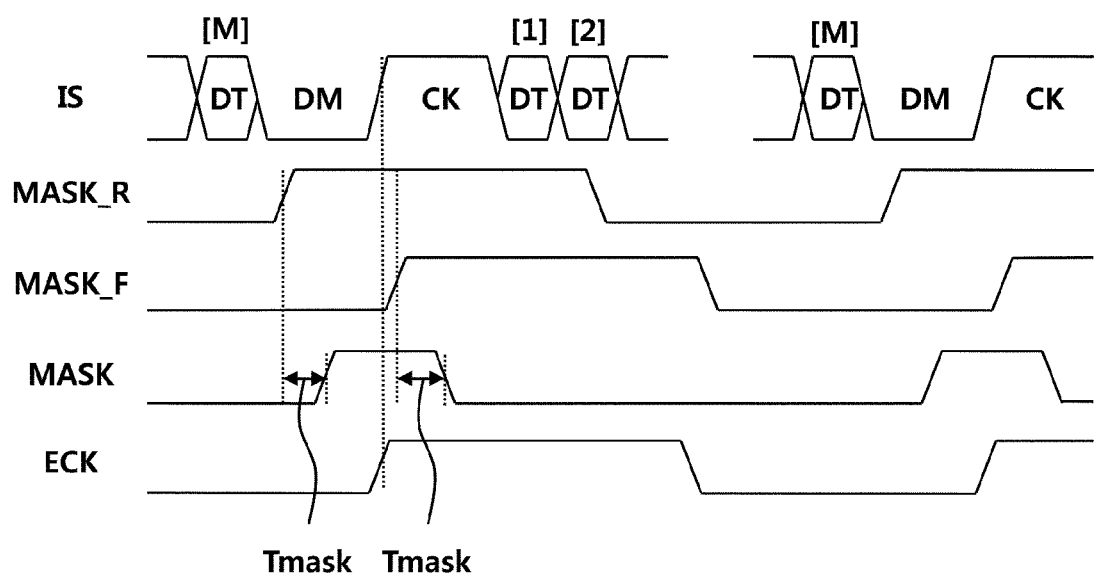
FIG. 3 illustrates a time difference between a mask rising signal and a mask falling signal, and a mask signal according to an embodiment.

FIG. 3 illustrates a time difference between a mask rising signal and a mask falling signal, and a mask signal.

Referring to FIG. 3, processing delay time Tmask may occur between a rising edge of a mask signal MASK and a mask rising signal MASK_R, and processing delay time Tmask may occur between a falling edge of the mask signal MASK and a mask falling signal MASK_F. The processing delay time Tmask is largely due to the processing delay time of a mask signal generating unit but may be affected by other factors.

The mask signal generating unit may generate the mask rising signal MASK_R and the mask falling signal MASK_F in view of the processing time delay Tmask in order to detect a clock signal CK nearly in the middle of an interval in which the mask signal MASK is at a high level.

For example, the mask signal generating unit may generate the mask rising signal MASK_R at a time advanced (less delayed) by the processing delay time Tmask from a time delayed by N−0.5 unit times from an extraction clock ECK and may generate the mask falling signal MASK_F at a time advanced (less delayed) by the processing delay time Tmask from a time delayed by N+0.5 unit times. Generally, the processing delay time Tmask may be set to 0.5 to 1 unit time.

In recent years, with an increase in data transfer rate, a unit time has become shorter. As a result, processing delay time Tmask has become longer on the basis of the unit time. For example, in conventional data transfer rate, processing delay time Tmask may correspond to one unit time. When data transfer rate increases by two times, processing delay time Tmask may correspond to two unit times.

In order to reflect a tendency to an increase in data transfer rate, the phase difference between the masking rising signal MASK_R and the extraction clock ECK may be controlled to be larger. For example, the mask rising signal MASK_R is conventionally formed by one unit time in advance for the extraction clock ECK, while the mask rising signal MASK_R is formed by two or three unit times in advance for the extraction clock ECK in updated products having an increased data transfer rate.

However, when the phase of the mask rising signal MASK_R is advanced, the mask signal MASK may be excessively advanced and may thus not indicate a time period for a clock signal CK or may thus indicate an interval for a data signal.

When a time period indicated by the mask signal MASK is an interval for a data signal, a clock extracting unit may mistake a data signal for a clock signal CK and may thus wrongly generate a clock. When the mask signal MASK does not indicate a time period for a clock signal CK, for example, when a falling edge of the mask signal MASK precedes a rising edge of a clock signal CK, the clock extracting unit cannot recognize the clock signal CK.

In order to solve these problems, according to an embodiment of the disclosure, a plurality of comparison signals may be generated by applying processing delay time Tmask to a plurality of mask rising signals MASK_R, and one comparison signal that is close to a portion, for example, a rising edge, of a clock signal CK may be selected from among the plurality of comparison signals. Further, according to the embodiment of the disclosure, a rising edge of a mask signal MASK may be formed according to a mask rising signal MASK_R that generates the selected comparison signal.

Some components of this embodiment may be the same as components described with reference to FIG. 1 to FIG. 3, and components of which the functions or details are omitted from the description can be understood with reference to the above description.

Figure 4:
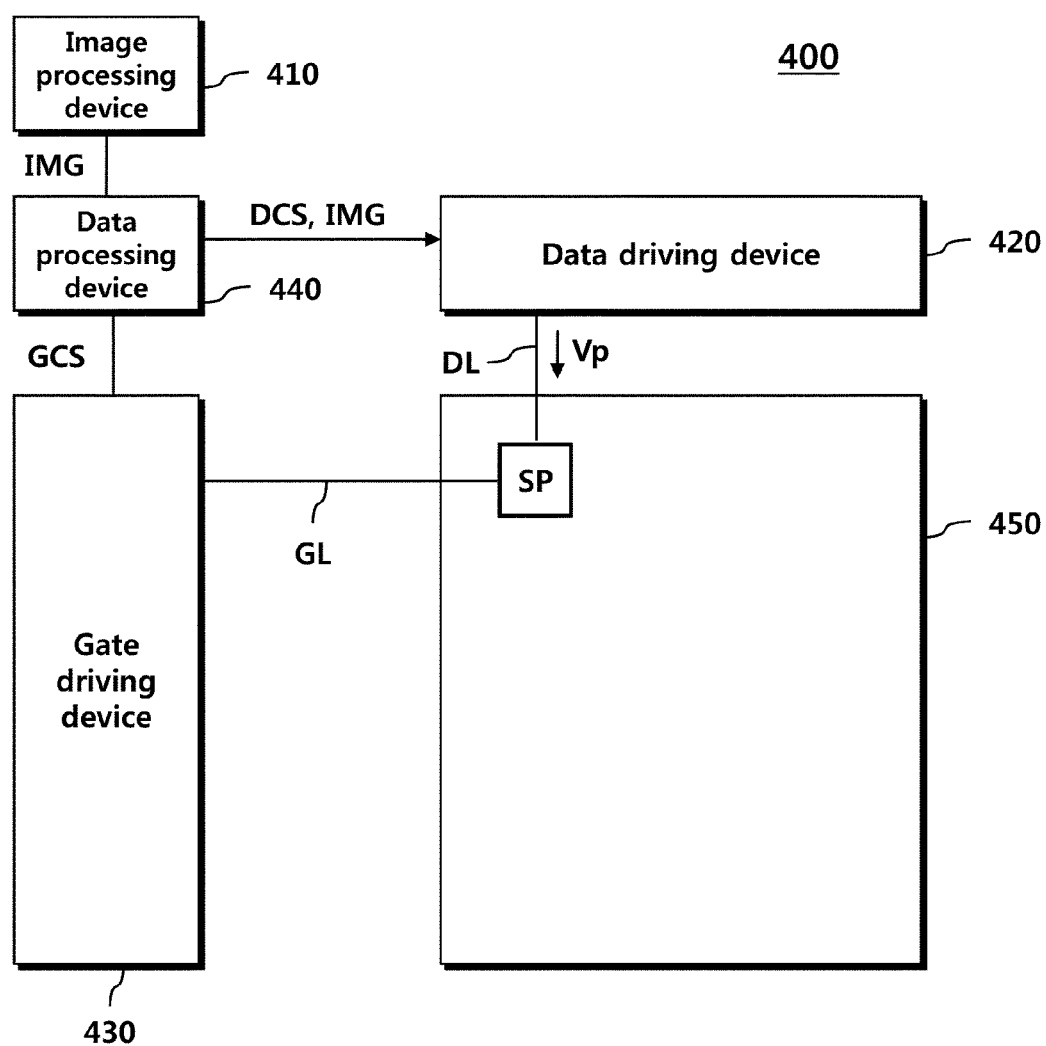
FIG. 4 is a block diagram illustrating a display device according to an embodiment.

FIG. 4 is a block diagram illustrating a display device according to an embodiment.

Referring to FIG. 4, the display device 400 may include a plurality of panel driving devices 410, 420, 430, and 440 and a display panel 450.

A plurality of data lines DL and a plurality of gate lines GL may be disposed on a display panel 450, and a plurality of pixels may be disposed on the display panel 450. A pixel P may include a plurality of sub-pixels SP. The sub-pixels may be red (R), green (G), blue (B), and white (W) sub-pixels. One pixel may include RGB sub-pixels SP, RGBG sub-pixels SP, or RGBW sub-pixels SP. Hereinafter, for the convenience of explanation, one pixel is described as including RGB sub-pixels.

The panel driving devices 410, 420, 430, and 440 are devices that generate signals to display an image on the display panel 450. The panel driving devices 410, 420, 430, and 440 may include an image processing device 410, a data driving device 420, a gate driving device 430, and a data processing device 440.

The gate driving device 430 may supply a gate driving signal of a turn-on voltage or a turn-off voltage to a gate line GL. When a gate driving signal of a turn-on voltage is supplied to a sub-pixel SP, the sub-pixel SP is connected to a data line DL. When a gate driving signal of a turn-off voltage is supplied to the sub-pixel SP, the sub-pixel SP is disconnected from the data line DL. The gate driving device 430 may be referred to as a gate driver.

The data driving device 420 may supply a data voltage Vp to a sub-pixel SP through a data line DL. The data voltage Vp supplied to the data line DL may be supplied to the sub-pixel SP according to a gate drive signal. The data driving device 420 may be referred to as a source driver.

The data processing device 440 may supply a control signal to the gate driving device 430 and the data driving device 420. For example, the data processing device 440 may transmit a gate control signal GCS, which initiates scanning, to the gate driving unit 430. Then, the data processing device 440 may output image data IMG to the data driving device 420. Further, the data processing device 440 may transmit a data control signal DCS that controls the data driving device 420 to supply a data voltage Vp to each sub-pixel SP. The data processing device 440 may be referred to as a timing controller.

The image processing device 410 may generate image data IMG and may transmit the image data IMG to the data processing device 440. The image processing device 410 may be referral to as a host.

A communication interface may be formed between the data processing device 440 and the data driving device 420, and the data processing device 440 may transmit the data control signal DCS and/or the image data IMG to the data driving device 420 through the communication interface.

Figure 5:
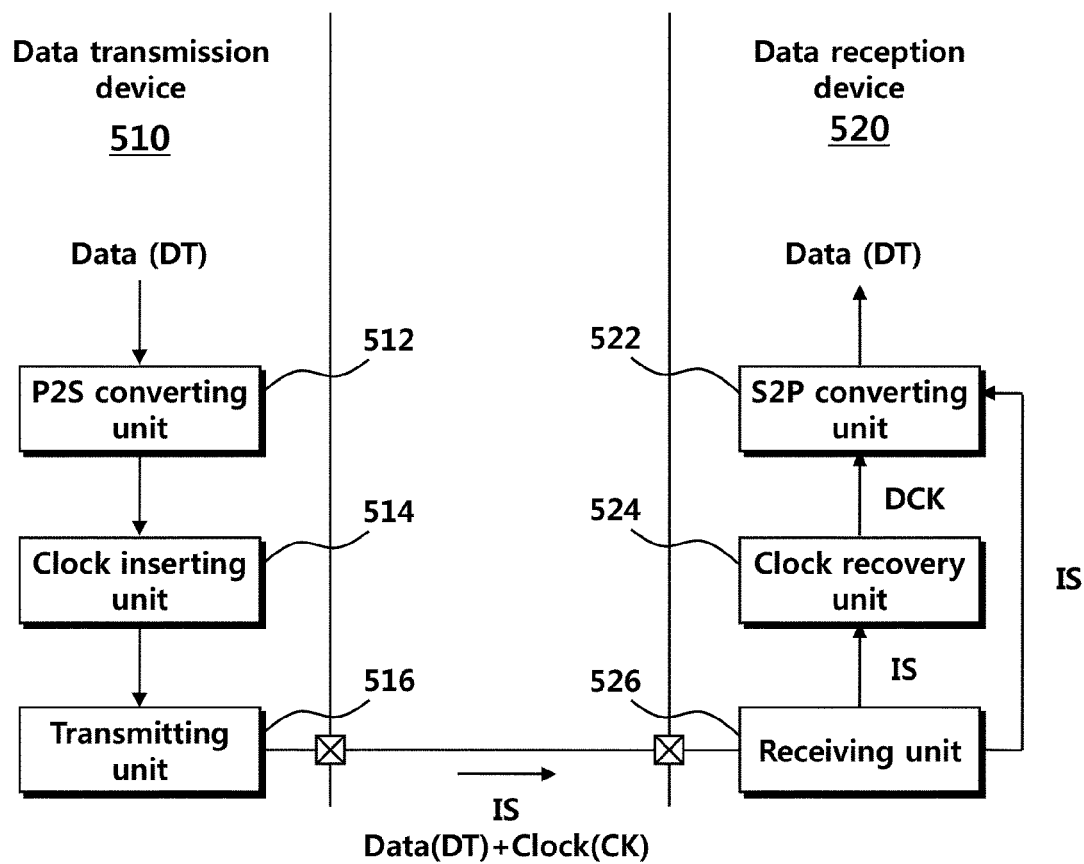
FIG. 5 is a block diagram illustrating a data transmission device and a data reception device according to an embodiment.

FIG. 5 is a block diagram illustrating a data transmission device 510 and a data reception device 520 according to an embodiment.

The data transmission device 510 illustrated in FIG. 5 may be included in one panel driving device described with reference to FIG. 4, and the data reception device 520 may be included in another panel driving device described with reference to FIG. 4.

In one example, the data transmission device 510 may be included in the data processing device 440 of FIG. 4, and the data reception device 520 may be included in the data driving device 420 of FIG. 4. In this case, the data transmission device 510 may transmit image data or a data control signal as data DT to be transmitted.

In another example, the data transmission device 510 may be included in the data driving device 420 of FIG. 4, and the data reception device 520 may be included in the data processing device 440 of FIG. 4. In this case, the data transmission device 510 may transmit sensing data about a pixel as data DT to be transmitted.

The data transmission device 510 may include a P2S converting unit 512, a clock inserting unit 514, and a transmitting unit 516.

The P2S converting unit 512 may convert data DT processed in parallel communication into serial communication. The clock inserting unit 514 may generate an interface signal IS by combining the serially converted data DT and a clock CK. The transmitting unit 516 may transmit the interface signal IS to the data reception device 520 through a signal line.

The data reception device 520 may include an S2P converting unit 522, a clock recovery unit 524, and a receiving unit 526.

The receiving unit 526 may receive the interface signal IS through the signal line. The clock recovery unit 524 may recover the clock CK from the interface signal IS, may generate a data clock signal DCK, and may transmit the generated data clock signal DCK to the S2P converting unit 522. The S2P converting unit (serial-to-parallel converting unit) 522 may convert a portion of the interface signal IS, in which a data signal is inserted, into parallel data through a data clock signal DCK, thereby recovering the data DT.

When the data transmission device 510 is included in the data processing device described with reference to FIG. 4 and the data reception device 520 is included in the data driving device described with reference to FIG. 4, the data DT may include image data or a data control signal.

When the data transmission device 510 is included in the data driving device described with reference to FIG. 4 and the data reception device 520 is included in the data processing device described with reference to FIG. 4, the data DT may be sensing data about a pixel.

Figure 6:
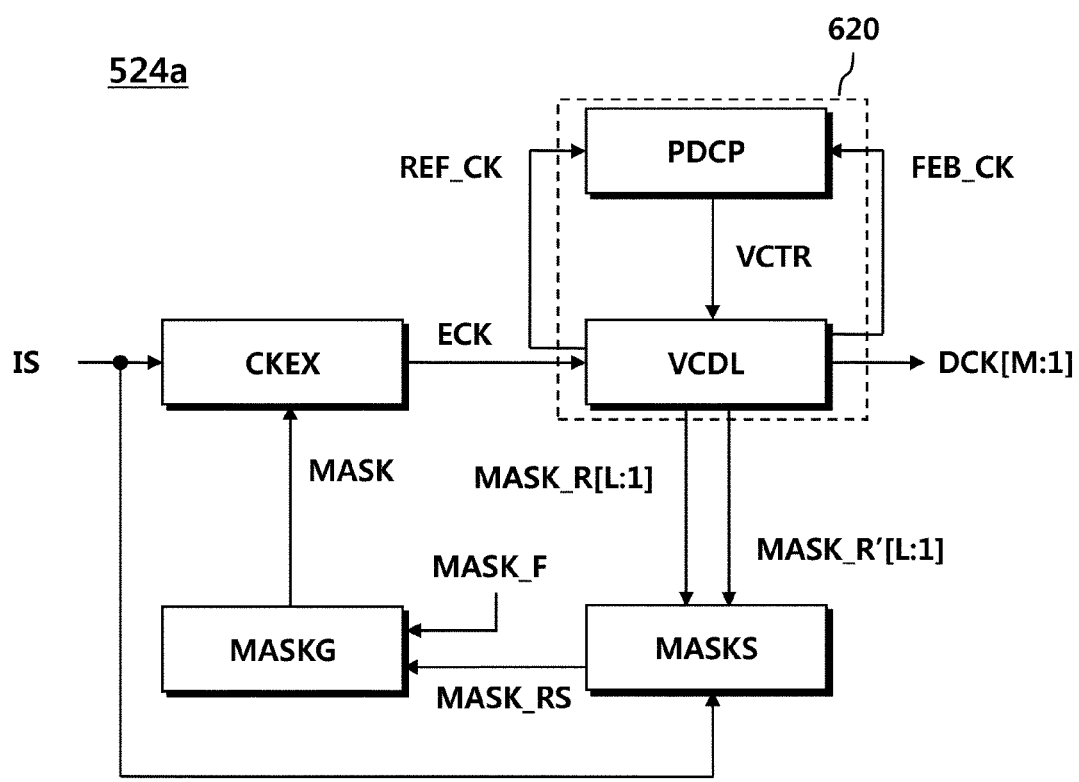
FIG. 6 is a block diagram illustrating a first example of a clock recovery unit according to an embodiment.

FIG. 6 is a block diagram illustrating a first example of a clock recovery unit 524a according to an embodiment.

Referring to FIG. 6, the clock recovery unit 524a may include a clock extracting unit CKEX, a time-delay controlling unit 620, a mask signal generating unit MASKG, and a mask signal selecting unit MASKS.

The clock extracting unit CKEX may generate an extraction clock ECK through a signal in a time period indicated by a mask signal MASK in an interface signal IS with a clock signal embedded therein.

The mask signal generating unit MASKG may form a rising edge of a mask signal MASK according to one mask rising signal MASK_R selected from a plurality of mask rising signals MASK_R[L:1] (where L is a natural number). For convenience of description, the one mask rising signal MASK_R selected from the plurality of mask rising signals MASK_R[L:1] is referred to as a mask rising selection signal MASK_RS.

The mask signal generating unit MASKG may form a falling edge of the mask signal MASK according to a mask falling signal MASK_F.

The mask signal generating unit MASKG may include an internal circuit including at least one logic circuit and may form the rising edge of the mask signal MASK according to the mask rising selection signal MASK_RS through the internal circuit Here, processing delay time of the internal circuit may occur, which may cause a predetermined time difference between the mask rising selection signal MASK_RS and the rising edge of the mask signal MASK.

The mask signal MASK may be transmitted to the clock extracting unit CKEX. The clock extracting unit CKEX may generate an extraction clock ECK through a signal in a time period indicated by the mask signal MASK in an interface signal IS with a clock signal embedded therein.

The time-delay controlling unit 620 may time-delay the extraction clock ECK to generate a plurality of data clock signals DCK[M:1] (where M is a natural number) and a plurality of mask rising signals MASK_R[L:1].

The time-delay controlling unit 620 may include a voltage control delay line unit VCDL and a phase difference feedback unit PDCP.

The voltage control delay line unit VCDL may include a delay circuit including a plurality of delay elements connected in series. The delay circuit may time-delay the extraction clock ECK to generate a plurality of data clock signals DCK[M:1] having different phases. The delay circuit may adjust the time-delay degree of each delay element according to a voltage control signal VCTR.

The phase difference feedback unit PDCP may generate a signal corresponding to the phase difference between a feedback clock FEB_CK and a reference clock REF_CK as a voltage control signal VCTR. The phase difference feedback unit PDCP may output the voltage control signal VCTR to each delay element included in the delay circuit.

The feedback clock FEB_CK may be one data clock signal generated by the voltage control delay line unit VCDL. The reference clock REF_CK may be another data clock signal resulting from one data clock signal that has passed through a predetermined number of delay elements.

One period of the interface signal IS may be divided into, for example, N unit times (where N is a natural number of two or greater) by which information is divided. The reference clock REF_CK may be a data clock signal generated by time-delaying the feedback clock FEB_CK by N unit times. Here, when the phases of the reference clock REF_CK and the feedback clock FEB_CK are synchronized, a unit time identified in a data reception device is synchronized with a unit time identified in a data transmission device.

The mask signal selecting unit MASKS may output a mask rising selection signal MASK_RS selected from a plurality of mask rising signals MASK_R[L:1] to the mask signal generating unit MASKG. The mask signal generating unit MASKG may form a rising edge of a mask signal MASK according to the mask rising selection signal MASK_RS.

The mask signal selecting unit MASKS may compare a plurality of comparison signals generated by delaying the plurality of mask rising signals MASK_R[L:1] by a predetermined time with the clock signal included in the interface signal IS. The mask signal selecting unit MASKS may select one comparison signal that is close to a portion, for example, a rising edge, of the clock signal from among the plurality of comparison signals. The mask signal selecting unit MASKS may select a mask rising signal MASK_R corresponding to the selected comparison signal and may output the mask rising signal MASK_R as a mask rising selection signal MASK_RS.

The mask signal selecting unit MASKS may compare a portion of a comparison signal with a portion of the clock signal. For example, the mask signal selecting unit MASKS may compare a rising edge of the comparison signal with the rising edge of the clock signal. The mask signal selecting unit MASKS may select one comparison signal having a rising edge close to the rising edge of the clock signal.

The mask signal selecting unit MASKS may select one comparison signal closest to the clock signal from among the plurality of comparison signals. Alternatively, the mask signal selecting unit MASKS may select one comparison signal that precedes the clock signal in time or phase and is closest to the clock signal from among the plurality of comparison signals. Alternatively, the mask signal selecting unit MASKS may select one comparison signal that follows the clock signal in time or phase and is closest to the clock signal from among the plurality of comparison signals.

A comparison signal may be a signal generated by delaying a mask rising signal MASK_R by a predetermined time. Here, signal processing delay time in the internal circuit of the mask signal generating unit MASKG may be reflected in the delayed predetermined time. For example, the mask signal selecting unit MASKS may generate a comparison signal by delaying a mask rising signal MASK_R by the signal processing delay time due to the internal circuit of the mask signal generating unit MASKG.

K unit times (where K is a positive number that is a multiple of 0.5) may be additionally reflected in the delayed predetermined time. For example, the mask signal selecting unit MASKS may generate a comparison signal by further delaying, by the signal processing delay time due to the internal circuit of the mask signal generating unit MASKG, a signal generated by delaying a mask rising signal MASK_R by K unit times.

The mask signal selecting unit MASKS may receive the signal generated by delaying the mask rising signal MASK_R by K unit times from the time-delay controlling unit 620. The time-delay controlling unit 620 may transmit a plurality of preliminary comparison signals MASK_R'[L:1], generated by delaying the plurality of mask rising signals MASK_R[L:1] by K unit times, to the mask signal selecting unit MASKS.

The mask signal selecting unit MASKS may generate a plurality of comparison signals by delaying the plurality of preliminary comparison signals MASK_R'[L:1] by the signal processing delay time of the mask signal generating unit MASKG.

Here, regarding K unit times, one period of the interface signal IS may be divided into a plurality of unit times by which information is divided, and K may be, for example, 0.5.

The mask signal selecting unit MASKS may further include a simulation circuit (not shown) that simulates the mask signal generating unit MASKG or simulates the signal processing delay time of the mask signal generating unit MASKG. The mask signal selecting unit MASKS may input a mask rising signal MASK_R or a preliminary comparison signal MASK_R' into the simulation circuit (not shown) and may generate a comparison signal as output thereof. The simulation circuit (not shown) may cause a time delay substantially corresponding to the signal processing delay time of the mask signal generating unit MASKG.

Figure 7:
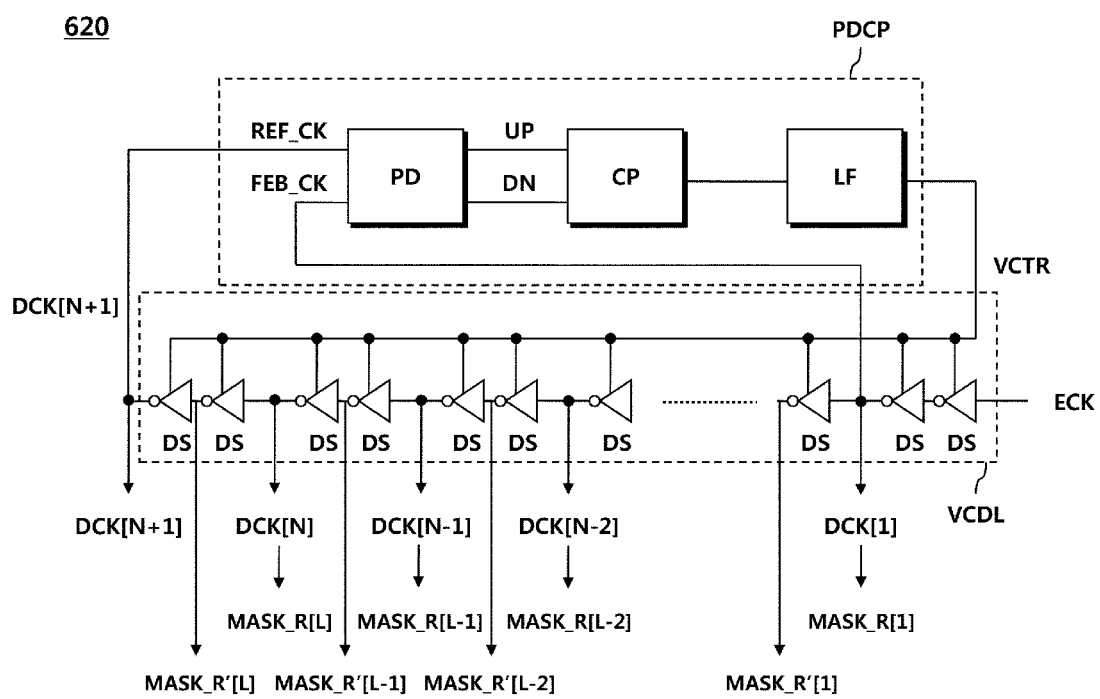
FIG. 7 is a block diagram illustrating a time-delay controlling unit according to an embodiment.

FIG. 7 is a block diagram illustrating a time-delay controlling unit according to an embodiment.

Referring to FIG. 7, the time-delay controlling unit 620 may include a voltage control delay line unit VCDL and a phase difference feedback unit PDCP.

The voltage control delay line unit VCDL may include a plurality of delay elements DS. Each delay element DS may be an inverter accompanying a time delay, and two delay elements DS may be responsible for a time delay of one unit time.

The voltage control delay line unit VCDL may generate a plurality of data clock signals DCK[N:1] using the plurality of delay elements DS.

The voltage control delay line unit VCDL may output one data clock signal among the plurality of data clock signals DCK[N:1] as a feedback clock FEB_CK and may output another data clock signal as a reference clock REF_CK. When one period of an interface signal is divided into N unit times, the reference clock REF_CK may be a clock obtained by time-delaying the feedback clock FEB_CK by N unit times.

The phase difference feedback unit PDCP may include a phase detector PD, a charge pump CP, and a filter LF.

The phase detector PD may selectively output an up signal UP and a down signal DN corresponding to the phase difference between the feedback clock FEB_CK and the reference clock REF_CK. The charge pump CP may generate an output voltage corresponding to the up signal UP and the down signal DN, and the filter LF may generate a voltage control signal VCTR according to the output voltage from the charge pump CP.

The voltage control signal VCTR may be a driving voltage for the delay element DS. Here, when the voltage of the voltage control signal VCTR is high, the current of the delay element DS may increase, thus reducing a time-delay in the delay element DS. On the contrary, when the voltage of the voltage control signal VCTR is low, the current of the delay element DS may be reduced, thus increasing the time-delay in the delay element DS.

The voltage control delay line unit VCDL may output a mask rising signal MASK_R and a mask falling signal MASK_F in addition to a data clock signal DCK.

The time-delay controlling unit 620 may output a plurality of mask rising signals MASK_R[L:1] generated through the plurality of delay elements DS. The time-delay controlling unit 620 may output a plurality of preliminary comparison signals MASK_R'[L:1] generated by delaying the plurality of mask rising signals MASK_R[L:1] by K unit times.

Figure 8:
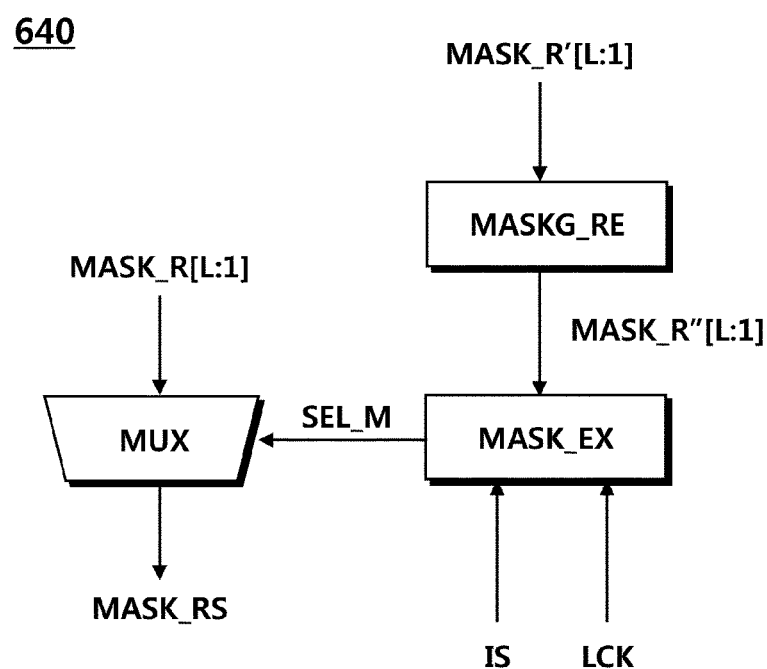
FIG. 8 is a block diagram illustrating a mask signal selecting unit according to an embodiment.

FIG. 8 is a block diagram illustrating a mask signal selecting unit according to an embodiment.

Referring to FIG. 8, the mask signal selecting unit 640 may include a multiplexer (MUX) circuit MUX, a selection signal circuit MASK_EX, and a simulation circuit MASKG_RE.

The MUX circuit MUX may receive a plurality of mask rising signals MASK_R[L:1] and a selection signal SEL_M and may output one of the plurality of mask rising signals MASK_R[L:1] as a mask rising selection signal MASK_RS according to the selection signal SEL_M.

The simulation circuit MASKG_RE may incur a time-delay substantially equal to the signal processing delay time of a mask signal generating unit. The simulation circuit MASKG_RE may receive a plurality of preliminary comparison signals MASK_R[L:1] and may output the plurality of preliminary comparison signals MASK_R'[L:1] via an internal time-delay circuit. The simulation circuit MASKG_RE may include the same circuit as the mask signal generating unit and may include a circuit that dominantly incurs a time delay in the mask signal generating unit. The simulation circuit MASKG_RE may generate a plurality of comparison signals MASK_R"[L:1] through this circuit.

The selection signal circuit MASK_EX may compare the plurality of comparison signals MASK_R"[L:1] with a clock signal embedded in an interface signal IS and may select one comparison signal MASK_R" close or closest to the clock signal from among the plurality of comparison signals MASK_R"[L:1]. The selection signal circuit MASK_EX may generate a selection signal SEL_M corresponding to the selected comparison signal MASK_R". The selection signal SEL_M may indicate the order of the selected comparison signal MASK_R". For example, when a third comparison signal MASK_R"[3] is selected, the selection signal SEL_M may be a signal indicating 3. The MUX circuit MUX may select a mask rising signal MASK_R in the order indicated by the selection signal SEL_M according to the selection signal SEL_M.

The selection signal circuit MASK_EX may further receive a lock signal LCK. The lock signal LCK is a signal related to a clock training and may be generated by a side receiving the interface signal IS. For example, the data reception device (see 520 of FIG. 5) described with reference to FIG. 5 may include a lock signal output unit (not shown) and may output a lock signal LCK through the lock signal output unit (not shown). When a clock training is required, the lock signal output unit (not shown) may set the voltage level of the lock signal LCK to a first level, for example, a low-voltage level. When the clock training is completed, the lock signal output unit (not shown) may set the voltage level of the lock signal LCK to a second level, for example a high-voltage level.

When the lock signal LCK indicates the completion of clock training, the mask signal selecting unit 640 may select and output the same mask rising signal as selected in the previous period among the plurality of mask rising signals MASK_R[L:1]. For example, when the lock signal LCK indicates the completion of clock training, the mask signal selecting unit 640 may consistently select a mask rising signal in the order selected in the previous period or in the order determined through a clock training from among the plurality of mask rising signals MASK_R[L:1].

In this manner, a mask rising selection signal MASK_RS may be fixed by the selection signal circuit MASK_EX. For example, when the lock signal LCK indicates the completion of clock training, the selection signal circuit MASK_EX may output a fixed selection signal SEL_M to consistently select a mask rising signal in the order selected in the previous period or in the order determined through a clock training from among the plurality of mask rising signals MASK_R[L:1].

Figure 9:
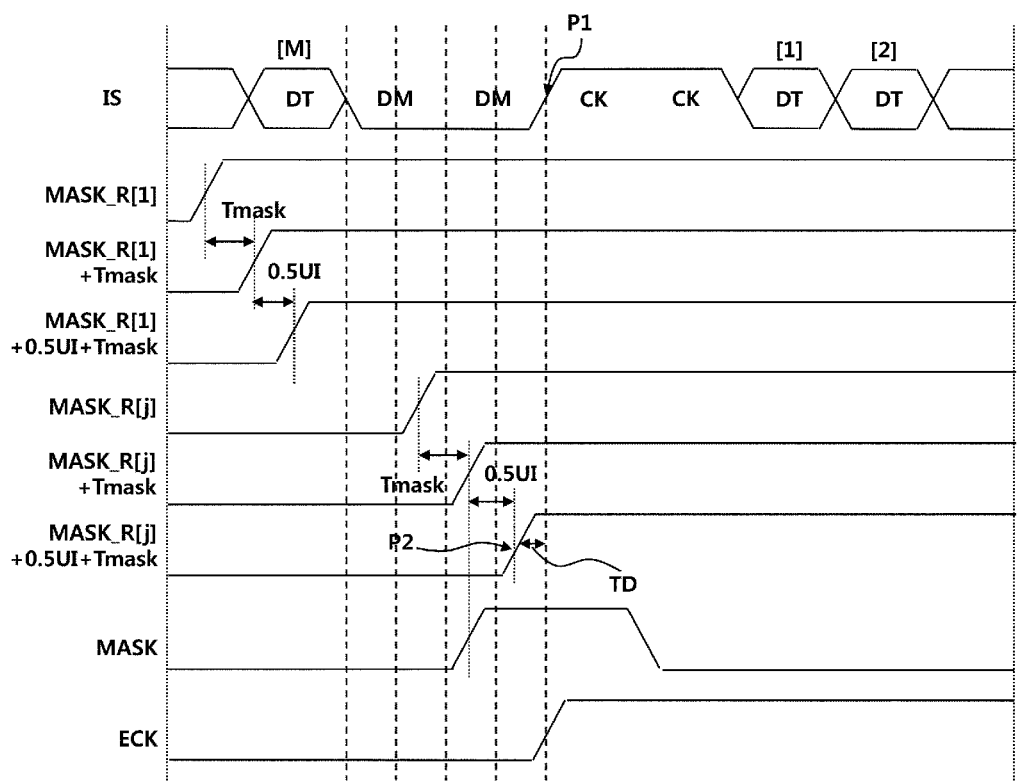
FIG. 9 is a timing diagram illustrating a first example of main signals in a clock recovery unit according to an embodiment.

FIG. 9 is a timing diagram illustrating a first example of main signals in a clock recovery unit according to an embodiment.

Referring to FIG. 9, one period of an interface signal IS may be divided into a plurality of unit times UI by which information is divided. Each unit time UI may indicate each bit of data with respect to a data signal DT. Each period of the interface signal IS may include a data signal DT having M bits (where M is a natural number of two or greater). A dummy signal DM interval may be disposed after the data signal DT, and a clock signal CK interval may be disposed after the dummy signal DM interval.

A dummy signal DM is a portion other than the data signal DT or a clock signal CK and may be inserted to maintain an interval between the data signal DT and the clock signal CK or may be inserted as a reserved interval for extension of the data signal DT. The dummy signal DM interval may correspond to one unit time or may correspond to two unit times as illustrated in FIG. 9.

A rising edge of a mask signal MASK is formed in the dummy signal DM interval, and a falling edge of the mask signal MASK is formed in the clock signal CK interval.

For example, the rising edge of the mask signal MASK is about 0.5 unit times UI ahead of a rising edge P1 of the clock signal CK. However, since processing delay time Tmask occurs in a mask signal generating unit, a mask rising signal MASK_R forming the rising edge of the mask signal MASK is 0.5 unit times UI plus the processing delay time Tmask of the mask signal generating unit ahead of the rising edge P1 of the clock signal CK.

Accordingly, a mask signal selecting unit may compare a rising edge P2 of a signal generated by delaying a mask rising signal MASK_R by 0.5 unit time UI and further delaying the same by the processing delay time Tmask of the mask signal generating unit with the rising edge P1 of the clock signal CK and may detect a mask rising signal having the smallest time difference TD between the rising edges. The mask signal selecting unit may select a mask rising signal corresponding to the smallest time difference TD.

Figure 10:
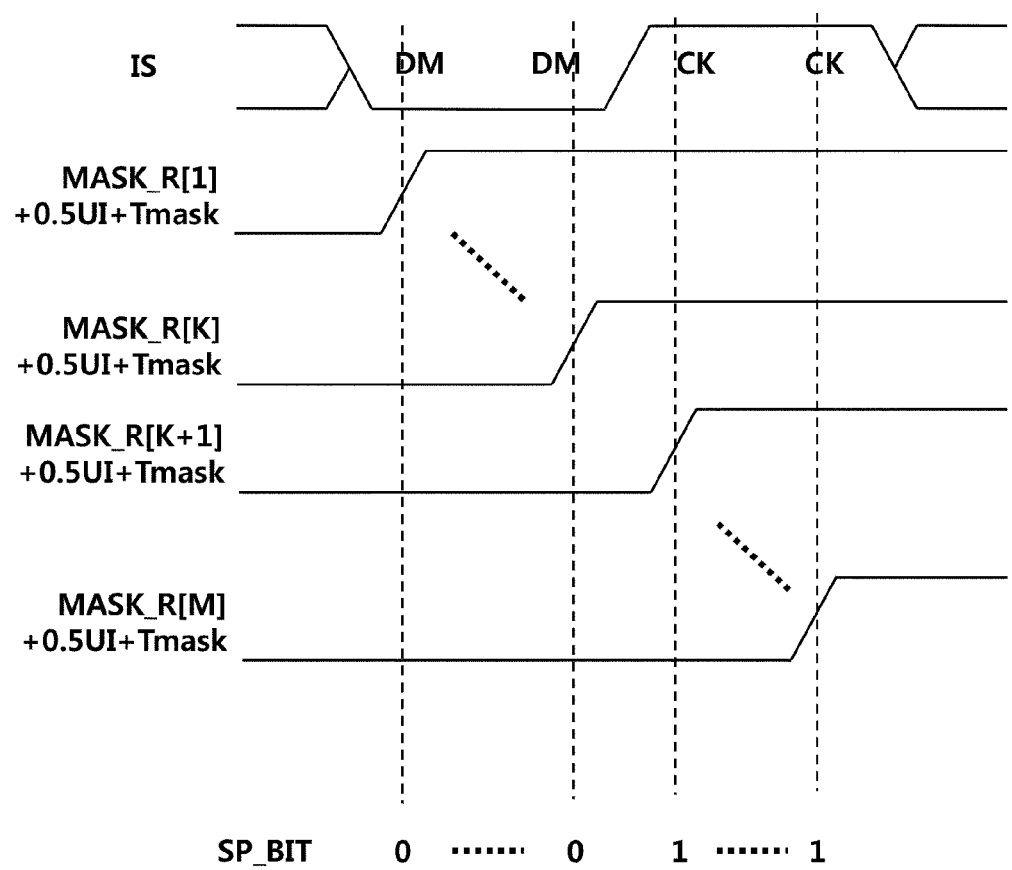
FIG. 10 is a timing diagram illustrating a second example of main signals in a clock recovery unit according to an embodiment.

FIG. 10 is a timing diagram illustrating a second example of main signals in a clock recovery unit according to an embodiment.

Referring to FIG. 10, a mask signal selecting unit may sample an interface signal IS using a plurality of comparison signals MASK_R[L:1]+0.5 UI+Tmask generated by delaying a plurality of mask rising signals MASK_R[L:1] by a predetermined time and may select one mask rising signal MASK_R corresponding to a portion where the sampled bit value SP_BIT is changed.

For example, since a dummy signal DM interval of the interface signal IS is sampled using a K-th comparison signal and previous comparison signals MASK_R[K:1]+0.5UI+Tmask sample, all sampled bit values SP_BIT may represent 0. However, since a clock signal CK interval of the interface signal IS is sample using a K+1th comparison signal and subsequent comparison signals MASK_R[M:(K+1)]+0.5UI+Tmask sample, all sampled bit values SP_BIT may represent 1. Here, the mask signal selecting unit may select and output a K-th mask rising signal MASK_R[K] in which a sampled bit value changes.

Figure 11:
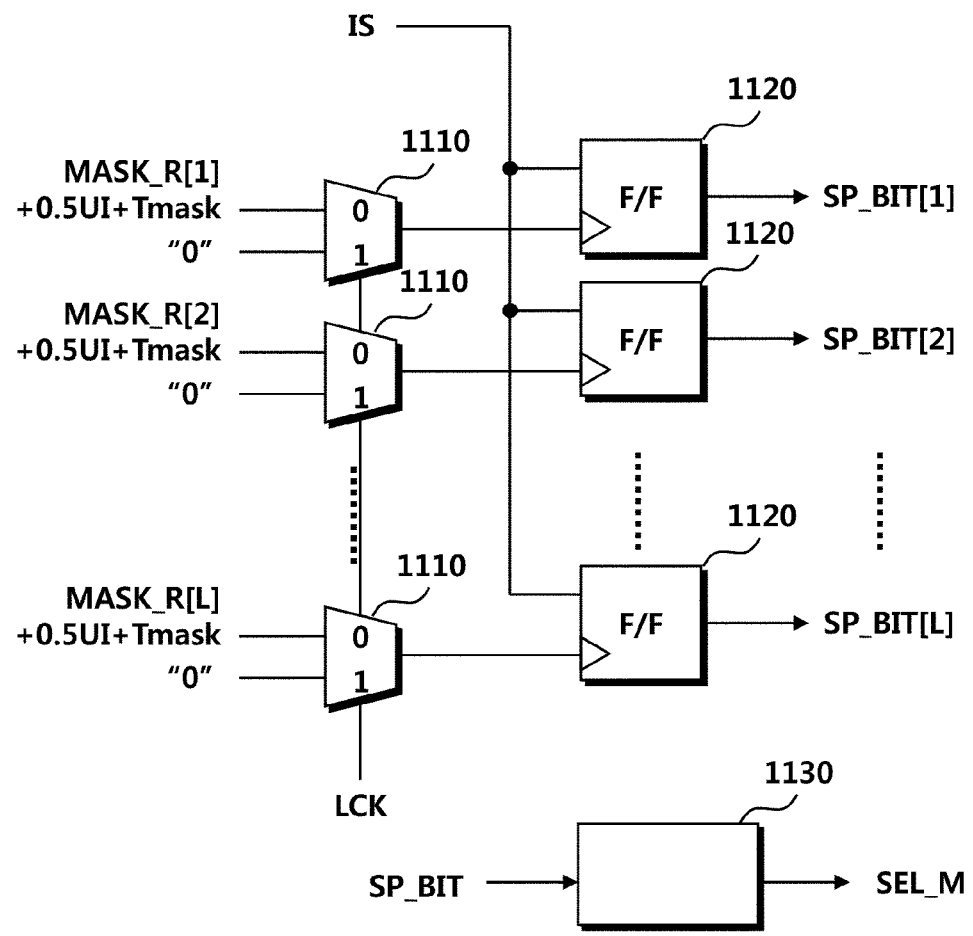
FIG. 11 is a block diagram illustrating a selection signal circuit according to an embodiment.

FIG. 11 is a block diagram illustrating a selection signal circuit according to an embodiment.

Referring to FIG. 11, the selection signal circuit MASK_EX may include a plurality of flip-flops 1120.

An interface signal IS may be input to one terminal of each flip-flop 1120. A comparison signal MASK_R+0.5UI+Tmask may be input to a clock terminal of each flip-flop 1120. The selection signal circuit MASK_EX may sample the interface signal IS with the comparison signal MASK_R+0.5UI+Tmask and may generate a sampling bit SP_BIT through the plurality of flip-flops 1120.

Referring to FIG. 11, the selection signal circuit MASK_EX may further include a control circuit 1130. The control circuit 1130 may analyze the sampling bit SP_BIT and may generate a selection signal SEL_M corresponding to a portion of the sampling bit SP_BIT in which a bit value changes.

Referring to FIG. 11, the selection signal circuit MASK_EX may further include a plurality of selection circuits 1110. Each selection circuit 1110 may selectively output a zero signal corresponding to a bit value of 0 and a comparison signal MASK_R+0.5UI+Tmask to the clock terminal of the flip-flop 1120. The selection circuit 1110 may output one of the zero signal and the comparison signal MASK_R+0.5UI+Tmask according to a lock signal LCK. For example, when the lock signal LCK indicates that a clock training is completed, the selection circuit 1110 may output the zero signal. Here, all sampling bits SP_BIT may be 0. When all the sampling bits SP_BIT are 0, for example, when the lock signal LCK indicates that a clock training is completed, the control circuit 1130 may consistently output the same selection signal SEL_M as previously output. To this end, the control circuit 1130 may further include a register or a memory that stores the selection signal SEL_M.

A mask falling signal may be generated in connection with a mask rising signal. However, when the mask falling signal is excessively advanced together with the mask rising signal, the mask falling signal may be positioned in a dummy signal interval, and a falling edge of a mask signal may also be positioned in the dummy signal interval due to the mask falling signal.

In a second example to be described with reference to FIG. 12, a falling edge of a mask signal may be generated according to an extraction clock instead of a mask falling signal, thereby resolving the foregoing problem.

Figure 12:
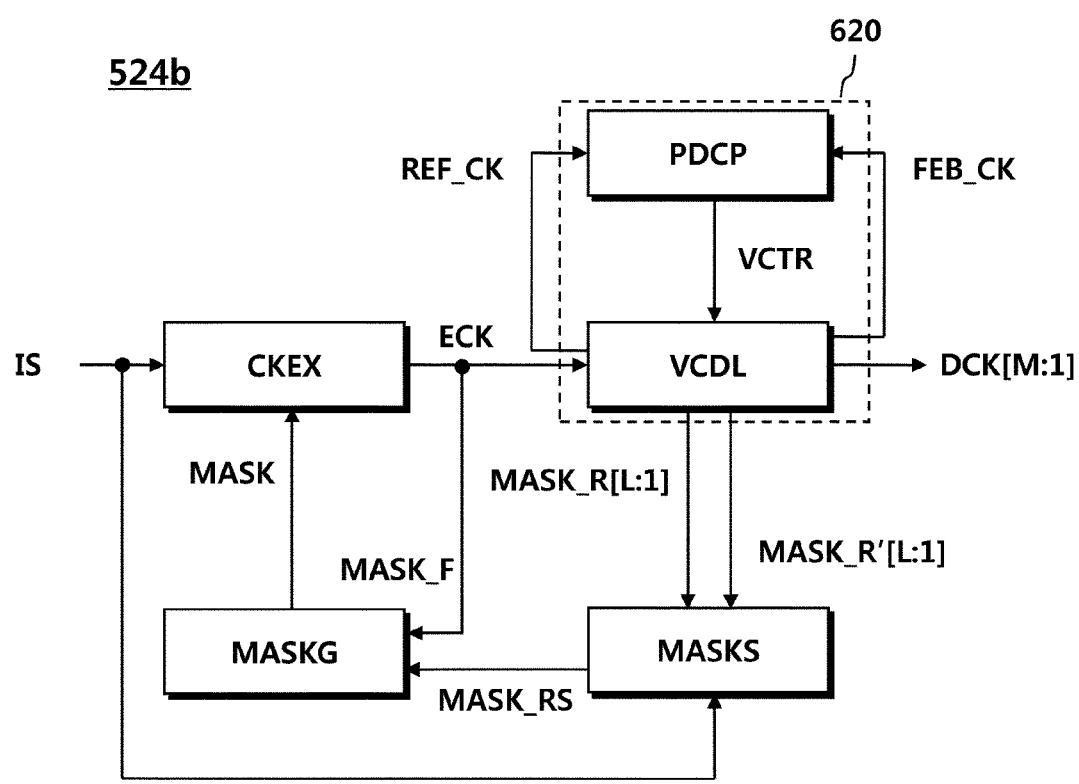
FIG. 12 is a block diagram illustrating a second example of a clock recovery unit according to an embodiment.

FIG. 12 is a block diagram illustrating a second example of a clock recovery unit according to an embodiment.

Referring to FIG. 12, the clock recovery unit 524b may include a clock extracting unit CKEX, a mask signal selecting unit MASKS, a mask signal generating unit MASKG, and a time-delay controlling unit 620.

The mask signal generating unit MASKG may generate a mask signal MASK according to a mask rising signal MASK_R. The mask signal generating unit MASKG may form a rising edge of the mask signal MASK according to the mask rising signal MASK_R.

The mask signal generating unit MASKG may generate the mask signal MASK according to an extraction clock ECK. The mask signal generating unit MASKG may form a falling edge of the mask signal MASK according to the extraction clock ECK. Alternatively, the mask signal generating unit MASKG may generate the mask signal MASK according to a signal obtained by delaying the extraction clock ECK by a predetermined time. The mask signal generating unit MASKG may form a falling edge of the mask signal MASK according to the signal obtained by delaying the extraction clock ECK by the predetermined time.

The mask signal generating unit MASKG may include a first internal circuit including at least one logic circuit and may form the rising edge of the mask signal MASK according to the mask rising signal MASK_R through the first internal circuit Here, processing delay time may occur in the first internal circuit, and a predetermined time difference may occur between the mask rising signal MASK_R and the rising edge of the mask signal MASK due to the processing delay time.

The mask signal generating unit MASKG may include a second internal circuit including at least one logic circuit and may form the falling edge of the mask signal MASK according to the extraction clock ECK through the second internal circuit Here, processing delay time may occur in the second internal circuit, and a predetermined time difference may occur between the extraction clock ECK and the falling edge of the mask signal MASK due to the processing delay time.

Processing delay time between the mask rising signal MASK_R and the rising edge of the mask signal MASK may be within 0.5 unit times, and processing delay time between the extraction clock ECK and the falling edge of the mask signal MASK may be within 0.5 unit times.

When a mask falling signal is positioned in a dummy signal interval and processing delay time required to generate a falling edge of a mask signal MASK using the mask falling signal is within 0.5 unit times, a time period indicated by the mask signal MASK may be included in the dummy signal interval, and thus a clock extracting unit may not extract a clock signal from an interface signal IS.

On the contrary, when the mask signal generating unit generates a falling edge of a mask signal MASK according to an extraction clock ECK, the mask signal MASK overlaps a clock signal interval by at least the foregoing processing delay time, thus preventing the foregoing problem.

Figure 13:
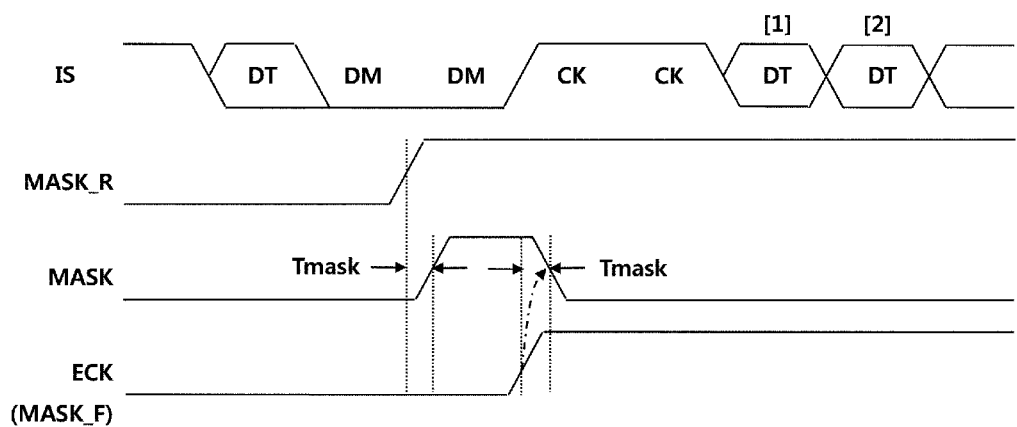
FIG. 13 is a timing diagram illustrating a third example of main signals in a clock recovery unit according to an embodiment.

FIG. 13 is a timing diagram illustrating a third example of main signals in a clock recovery unit according to an embodiment.

Referring to FIG. 13, a rising edge of a mask signal MASK is formed using a mask rising signal MASK_R, and a predetermined time delay occurs between a rising edge of the mask rising signal MASK_R and the rising edge of the mask signal MASK due to processing delay time in the mask signal generating unit MASKG.

Referring to FIG. 13, a falling edge of the mask signal MASK is formed using an extraction clock ECK, and a predetermined time delay occurs between a rising edge of the extraction clock ECK and the falling edge of the mask signal MASK due to processing delay time in the mask signal generating unit MASKG.

Figure 14:
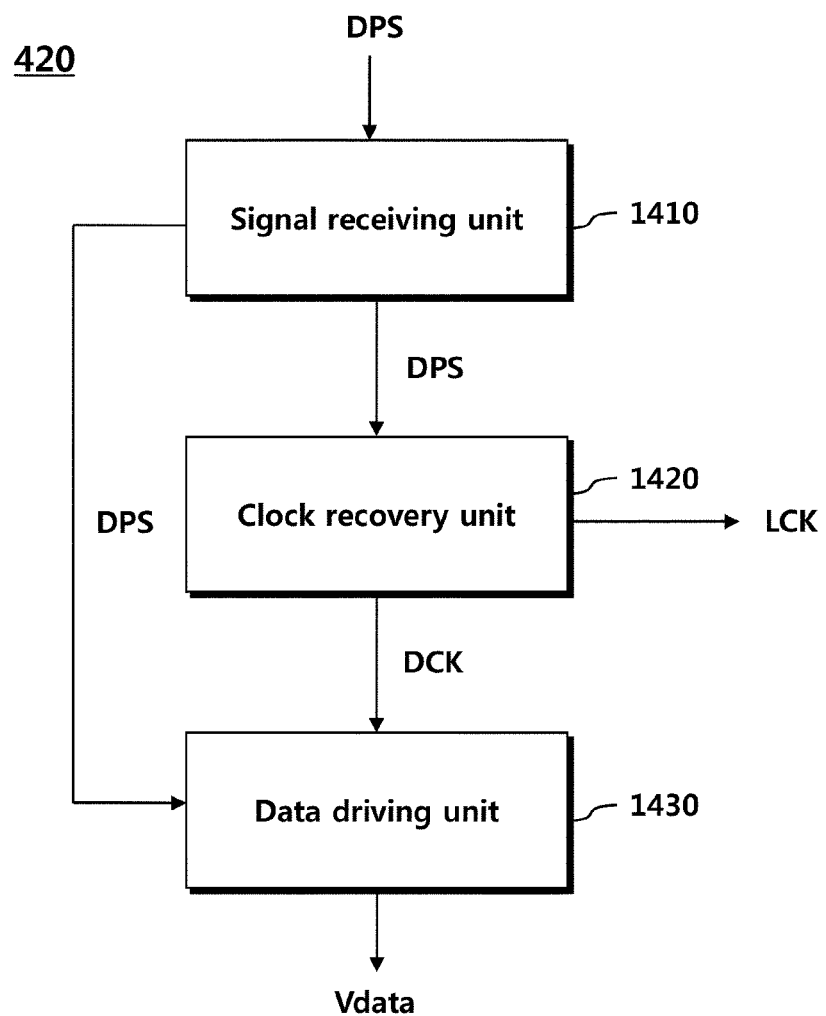
FIG. 14 is a block diagram illustrating a data driving device according to an embodiment.

FIG. 14 is a block diagram illustrating a data driving device according to an embodiment.

Referring to FIG. 14, the data driving device 420 may include a signal receiving unit 1410, a clock recovery unit 1420, and a data driving unit 1430.

The signal receiving unit 1410 may receive a display signal DPS with a clock signal embedded therein from a data processing device. The display signal DPS is a type of interface signal, may include a data control signal and data, such as image data, and may have a clock signal embedded therein.

The clock recovery unit 1420 may generate a plurality of data clock signals DCK by recovering the clock signal from the display signal DPS.

The data driving unit 1430 may extract image data from the display signal DPS according to the plurality of data clock signals DCK and may generate a data voltage Vdata according to the image data to drive pixels disposed on a panel.

The clock recovery unit 1420 may generate an extraction clock through a time period indicated by a mask signal in the display signal DPS and may generate the plurality of data clock signals DCK and a plurality of mask rising signals using the extraction clock. The clock recovery unit 1420 may select one mask rising signal, which is delayed by a predetermined time to generate a signal close to one portion of the clock signal, from among the plurality of mask rising signals and may form a rising edge of the mask signal according to the selected mask rising signal.

In the display signal, a dummy signal interval may exist subsequent to the last data bit.

The clock recovery unit may generate a falling edge of the mask signal according to the extraction clock or may generate a falling edge of the mask signal according to a signal generated by delaying the extraction clock by a predetermined time.

The display signal may be a serial signal, and the data driving unit may include a serial-to-parallel converting unit that converts a portion of the display data in the display signal into parallel data.

The clock recovery unit 1420 may include a lock signal output unit (not shown) that outputs a lock signal LCK. When a clock training is required, the lock signal output unit (not shown) may set the voltage level of the lock signal LCK to a first level. When the clock training is completed, the lock signal output unit (not shown) may set the voltage level of the lock signal LCK to a second level. When the lock signal LCK indicates the completion of clock training, the clock recovery unit 1420 may consistently select a mask rising signal in the order determined through the clock training from among the plurality of mask rising signals.

According to the foregoing embodiments, it is possible to accurately recover a clock signal from an interface signal.

What is claimed is:

1. A clock recovery device comprising:
   a mask signal selecting unit configured to compare a plurality of comparison signals, generated by delaying a plurality of mask rising signals by a predetermined time, with a clock signal and to select one mask rising signal used to generate a comparison signal close to one portion of the clock signal from among the plurality of mask rising signals;
   a mask signal generating unit configured to form a rising edge of a mask signal according to the selected one mask rising signal;
   a clock extracting unit configured to generate an extraction clock from an interface signal with the clock signal embedded therein in a time period in which the mask signal is activated; and
   a time-delay controlling unit configured to generate the plurality of mask rising signals by time-delaying the extraction clock.

2. The clock recovery device of claim 1, wherein the mask signal selecting unit reflects a time, obtained by simulating a signal processing delay time of the mask signal generating unit, in the predetermined time to generate the plurality of comparison signals.

3. The clock recovery device of claim 2, wherein one period of the interface signal is divided into a plurality of unit times by which information is divided, and K unit times is additionally reflected in the predetermined time, where K is a positive number that is a multiple of 0.5.

4. The clock recovery device of claim 2, wherein the mask signal generating unit generates the plurality of comparison signals using a simulation circuit that causes a time delay substantially corresponding to the signal processing delay time.

5. The clock recovery device of claim 1, wherein one period of the interface signal is divided into a plurality of unit times by which information is divided, and the mask signal selecting unit receives a plurality of preliminary comparison signals, generated by delaying the plurality of mask rising signals by 0.5 unit times, from the time-delay controlling unit and generates the plurality of comparison signals by delaying the plurality of preliminary comparison signals by the signal processing delay time of the mask signal generating unit.

6. The clock recovery device of claim 1, wherein the mask signal generating unit generates a falling edge of the mask signal according to the extraction clock or generates the falling edge of the mask signal according to a signal generated by delaying the extraction clock by a predetermined time.

7. The clock recovery device of claim 1, wherein the time-delay controlling unit comprises:
   a delay circuit configured to generate the plurality of data clock signals having different phases by time-delaying the extraction clock through a plurality of delay elements connected in series and to adjust a time-delay degree of each of the delay elements according to a voltage control signal; and
   a phase difference feedback unit configured to generate the voltage control signal corresponding to a phase difference between one data clock signal and another data clock signal resulting from the one data clock signal that has passed through a predetermined number of delay elements and to output the voltage control signal to each delay element.

8. A clock recovery device comprising:
   a clock extracting unit configured to generate an extraction clock through a signal from an interface signal with a clock signal embedded therein in a time period in which a mask signal is activated;
   a time-delay controlling unit configured to generate a plurality of mask rising signals by time-delaying the extraction clock;
   a mask signal selecting unit configured to sample the interface signal using a plurality of comparison signals, generated by delaying the plurality of mask rising signals by a predetermined time, and to select one mask rising signal corresponding to a portion where a sampled bit value is changed; and
   a mask signal generating unit configured to form a rising edge of the mask signal according to the selected one mask rising signal.

9. The clock recovery device of claim 8, wherein the mask signal selecting unit comprises a multiplexor circuit configured to select one mask rising signal from among the plurality of mask rising signals according to a selection signal generated in response to the portion where the bit value is changed.

10. The clock recovery device of claim 8, wherein the mask signal selecting unit samples the interface signal through a plurality of flip-flops configured to receive the interface signal through one terminal and the comparison signals through a clock terminal.

11. The clock recovery device of claim 10, wherein the mask signal selecting unit comprises a plurality of selection circuits configured to selectively output a zero signal corresponding to a bit value of 0 and the comparison signals to the clock terminal of a flip-flop, and
   each of the selection circuits output one of the zero signal and the comparison signals according to a signal indicating a completion of clock training.

12. A source driver comprising:
   a signal receiving unit configured to receive a display signal with a clock signal embedded therein;
   a clock recovery unit configured to generate a plurality of data clock signals by recovering the clock signal from the display signal; and
   a data driving unit configured to extract image data from the display signal according to the plurality of data clock signals and to drive pixels disposed on a panel according to the image data,
   wherein the clock recovery unit comprises a mask signal selecting unit, a mask signal generating unit, a clock extracting unit, and a time-delay controlling unit,
   wherein the mask signal selecting unit is configured to compare a plurality of comparison signals, generated by delaying a plurality of mask rising signals by a predetermined time, with the clock signal and to select one mask rising signal used to generate a comparison signal close to one portion of the clock signal from among the plurality of mask rising signals,
   wherein the mask signal generating unit is configured to form a rising edge of a mask signal according to the selected one mask rising signal,
   wherein the clock extracting unit is configured to generate an extraction clock from the display signal with the clock signal embedded therein in a time period in which the mask signal is activated, and wherein the time-delay controlling unit is configured to generate the plurality of mask rising signals by time-delaying the extraction clock.

13. The source driver of claim 12, wherein the clock recovery unit comprises a lock signal output unit configured to output a lock signal, and the lock signal output unit sets a voltage level of the lock signal to a first level when clock training is required, and sets the voltage level of the lock signal to a second level when the clock training is completed.

14. The source driver of claim 13, wherein when the lock signal indicates a completion of the clock training, the clock recovery unit consistently selects a mask rising signal in an order determined through the clock training from among the plurality of mask rising signals.

15. The source driver of claim 12, wherein the clock recovery unit generates a falling edge of the mask signal according to the extraction clock or generates the falling edge of the mask signal according to a signal generated by delaying the extraction clock by a predetermined time.

* * * * *